(12) United States Patent
Dietz et al.

(10) Patent No.: US 7,009,256 B2
(45) Date of Patent: Mar. 7, 2006

(54) SEMICONDUCTOR OVER-VOLTAGE PROTECTION STRUCTURE FOR INTEGRATED CIRCUIT AND FOR DIODE

(75) Inventors: Franz Dietz, Heilbronn (DE); Michael Graf, Leonberg (DE)

(73) Assignee: Atmel Germany GmbH, Heilbronn (DE)

( * ) Notice: Subject to any disclaimer, the term of this patent is extended or adjusted under 35 U.S.C. 154(b) by 8 days.

(21) Appl. No.: 10/945,719

(22) Filed: Sep. 20, 2004

(65) Prior Publication Data

US 2005/0062110 A1   Mar. 24, 2005

(30) Foreign Application Priority Data

Sep. 18, 2003   (DE) .............................. 103 43 681

(51) Int. Cl.
*H01L 23/62* (2006.01)

(52) U.S. Cl. ...................... 257/361; 257/362
(58) Field of Classification Search ................ 257/361, 257/362, 355

See application file for complete search history.

(56) References Cited

U.S. PATENT DOCUMENTS

| | | | |
|---|---|---|---|
| 4,862,310 A | 8/1989 | Harrington, III | |
| 5,241,210 A | 8/1993 | Nakagawa et al. | |
| 6,242,763 B1 | 6/2001 | Chen et al. | |
| 6,268,639 B1 | 7/2001 | Li et al. | |
| 2002/0063289 A1 * | 5/2002 | Su et al. ..................... | 257/355 |
| 2002/0153564 A1 | 10/2002 | Shirai | |
| 2003/0162375 A1 | 8/2003 | Chen et al. | |
| 2005/0110095 A1 * | 5/2005 | Shih et al. .................. | 257/361 |

FOREIGN PATENT DOCUMENTS

JP   61035568   2/1986

* cited by examiner

*Primary Examiner*—Phat X. Cao
(74) *Attorney, Agent, or Firm*—W. F. Fasse; W. G. Fasse

(57) ABSTRACT

A monolithically integratable semiconductor structure serves for over-voltage protection in an integrated circuit or as a normal diode. The structure includes an insulating layer between a substrate and a semiconductor layer of first conductivity type, and several layers formed in the semiconductor layer. First and second layers of second conductivity type are spaced apart from one another. A third layer of first conductivity type contacts the second layer. A fourth layer of first conductivity type directly contacts and surrounds the second and third layers. A fifth layer of first conductivity type and higher dopant concentration than the semiconductor layer is disposed under the first layer. The first layer surrounds the second, third and fourth layers essentially in a ring-shape. A first electrode contacts the first layer. A second electrode contacts the second and third layers.

19 Claims, 2 Drawing Sheets

SEMICONDUCTOR OVER-VOLTAGE PROTECTION STRUCTURE FOR INTEGRATED CIRCUIT AND FOR DIODE

PRIORITY CLAIM

This application is based on and claims the priority under 35 U.S.C. §119 of German Patent Application 103 43 681.2, filed on Sep. 18, 2003, the entire disclosure of which is incorporated herein by reference.

FIELD OF THE INVENTION

The invention relates to an over-voltage protection structure in a semiconductor arrangement that may be an integrated circuit or a diode, and that generally includes several doped layers formed in a semiconductor layer arranged on a substrate with an insulating layer therebetween.

BACKGROUND INFORMATION

In connection with the handling and use of integrated circuits (IC), it is necessary to protect the circuit elements and circuit assemblies included therein from the effects of over-voltage conditions. In this regard, over-voltages or over-voltage conditions refer to electrical signals in a voltage range above the normal operating voltage range of the circuit, and in a voltage range that could otherwise damage the circuit. Such over-voltage conditions, for example, typically arise through a discharge of an accumulated static charge, e.g. from people or machine components through the IC or from the IC through people or machine components. Such discharge processes are also commonly referred to as electrostatic discharge or ESD processes.

If such over-voltage signals, which may have an amplitude of several kilovolts, are applied to an integrated circuit, irreversible changes and damage of the components or assemblies of the IC can thereby be caused, for example through thin film burn-out, filamentation and short-circuiting of layer junctions or junction spiking, charge carrier injection into oxide layers, or oxide rupture, which can even lead to total destruction of the entire IC under certain conditions. This danger exists especially in the case of applications in motor vehicles or automobiles in which ICs are typically designed and embodied for processing signals with positive polarity. In this case, if the substrate or ground potential is briefly and temporarily shifted, due to an ESD event, to a potential that is not the lowest potential of the circuit, this can bias diode pathways of circuit components in a forward conducting direction, for example, which in turn can lead to the above mentioned damages of the affected components or entire component assemblies. On the other hand, particularly in applications in the automobile industry, it is desired to enable certain contacts of an IC to be temporarily loaded with a voltage below the ground potential, without this voltage in this regard being limited to the value of a diode forward conducting voltage.

While the above problems arise in conventional bulk technologies (i.e. with a bulk semiconductor substrate), which are mentioned as an example, they are not limited to such a field. Namely, such problems also arise in applications using SOI (Silicon On Insulator) technologies, within the scope of the present invention, and especially in the field of applications in the automobile industry.

In view of the above described danger to integrated circuits represented by ESD effects, it has been known to provide special semiconductor structures for limiting over-voltages in the ICs. Such special semiconductor structures are intended to conduct-away the briefly arising extremely high currents (with a current value of several amperes) associated with ESD events, without causing any damage or disruption of the IC. Moreover, such special semiconductor structures are intended to remain inactive during the normal operation of the IC. In this regard, the special protective structures satisfy their intended functions ever better, the more uniformly they trigger and the lower their ohmic resistance in the triggered state (low power dissipation). In bulk technologies, a buried layer is typically provided in the substrate for reducing the ohmic resistance, but such a buried layer normally does not exist, i.e. is normally not used, in SOI technologies due to reasons of cost and/or difficult practical realization thereof. Moreover, due to the higher wafer prices in connection with SOI applications, it is economically not sensible to simply enlarge the components for achieving a simple adaptation of the resistance.

U.S. Patent Application Publication U.S. 2002/0153564 A1 (Shirai) discloses a previously known conventional semiconductor structure in the above mentioned general field. The known semiconductor structure comprises a lateral bipolar pnp-transistor structure arranged in an n-doped Si layer of an SOI substrate, having p-doped first and second layers that are formed in the Si layer and are spaced apart from one another, an n-doped third layer formed in contact with the second layer in the SI layer, a first electrode (anode) in contact with the first layer, a second electrode (cathode) in contact with the second and third layers, as well as an n-doped fourth layer formed in contact with the second and third layers in the Si layer. Such a structure corresponds to a bipolar pnp-transistor, of which the base and emitter are short-circuited to each other. Furthermore, according to the above mentioned publication, the second, third and fourth layers (cathode side) may, if applicable, be arranged so as to surround the first layer (anode side) essentially in a ring-shape at a certain spacing distance.

Upon the occurrence of a voltage drop between the cathode and the anode, corresponding to a positive ESD pulse applied to the cathode or a negative ESD pulse applied to the anode, this will give rise to a voltage breakdown, whereby a zone that is depleted as to positive charge carriers will expand and extend from the anode side to the cathode side, in connection with a resulting current flow oriented from the cathode to the anode in the conventional sense. The n-doped fourth layer on the cathode side serves to adapt and particularly increase the breakdown voltage.

In the subject matter of the above mentioned publication U.S. 2002/0153564 A1, it is especially disadvantageous, that only a relatively nonuniform breakdown characteristic or behavior can be achieved as a result of local field concentrations or increases due to the concrete embodiment of the disclosed semiconductor structure in the area of the first (anode) layer. The disclosed structure and the resulting relatively non-uniform breakdown behavior are necessarily associated with a corresponding local increased current flow and power or energy transfer. Thus, there still exists a danger of damage to the semiconductor structure especially arising in this local area with an increased or concentrated current flow. In any event, the field of application is constrained with respect to the voltage that is to be limited.

Other conventional semiconductor structures suffering the same or similar disadvantages are disclosed in U.S. Pat. No. 4,862,310 (Harrington, Ill.), U.S. Pat. No. 5,241,210 (Nakagawa et al.), U.S. Pat. No. 6,242,763 (Chen et al.) and in U.S. Patent Application Publication U.S. 2003/0162375 A1 (Chen). The semiconductor structures, and the overall subject matters of these publications are, however, in principle not predominantly intended or suitable for use as ESD protective elements.

SUMMARY OF THE INVENTION

In view of the above, it is an object of the invention to provide a semiconductor structure of the above mentioned general type, which is characterized by a very uniform breakdown characteristic or behavior and thus a high current-carrying capacity or current withstand strength, a high operational security and reliability, and a corresponding broad field of application. The invention further aims to avoid or overcome the disadvantages of the prior art, and to achieve additional advantages, as apparent from the present specification. The attainment of these objects is, however, not a required limitation of the claimed invention.

The above objects have been achieved according to the invention in a semiconductor structure comprising a substrate, a semiconductor layer of a first conductivity type arranged on the substrate with an insulating layer interposed therebetween, first and second layers of the second conductivity type formed spaced apart from one another in the semiconductor layer, a third layer of the first conductivity type formed in contact with the second layer in the semiconductor layer, a first electrode in contact with the first layer, a second electrode in contact with the second and third layers, a fourth layer of the first conductivity type formed respectively in direct contact with and surrounding the second and third layers in the semiconductor layer, and a fifth layer of the first conductivity type that is formed under or below the first layer in the semiconductor layer and that has a higher doping or dopant concentration than that of the semiconductor layer. Furthermore, the first layer surrounds the second, third and fourth layers in essentially a ring-shape.

Through the fifth layer having the complementary conductivity type (also called "breakdown doping" in the following) arranged under or below the first layer (also called "anode layer" in the following), the clamp voltage of the inventive semiconductor structure may be adjusted. Moreover, the provision of a complementary doped zone under or below the anode ensures that field increases or concentrations due to the (relatively) high doping will not arise on the anode, whereby such field increases could otherwise be triggers for causing damage in the case of an ESD event. For this reason, in preferred embodiments of the invention, the fifth layer is preferably formed with a dimension that is less than a dimension of the first layer along a boundary or interface surface with the first layer.

According to the invention, the second layer functions as an emitter, whereby a transistor behavior is initially prevented due to the common electrode contact, i.e. a short-circuit of the second and third layers ("base contact layer") with each other. After the occurrence of a breakdown on or under the anode, a voltage drop in the fourth layer (base doping) under the emitter layer leads to a voltage biasing of the base-emitter junction in the forward conducting direction, so that a transistor characteristic or behavior is enabled between the emitter and the collector (first layer). For this purpose, the fourth layer advantageously surrounds the second and third layers in the manner of a well, whereby the fourth layer directly contacts the second and third layers. In this manner, the inventive transistor "switches" into a low resistance condition and therefore correspondingly serves to conduct-away potentially damaging currents, especially in the case of an ESD event. The above briefly described switching process is represented as a steep rise or increase of the collector current in an $I_C$-$V_{CE}$ characteristic curve, whereby simultaneously the voltage between the collector and the emitter $V_{CE}$ springs back to the so-called snapback value. Thereafter, the value of $V_{CE}$ barely changes with increasing current strength.

Due to the further special preferred feature of the invention that the first layer surrounds the second, third and fourth layers essentially in a ring-shape, the resulting structure has an enlarged anode surface area in comparison to previously known ESD protective structures, whereby the breakdown characteristic or behavior and the current withstand strength are further positively influenced.

A further preferred feature of the inventive semiconductor structure is characterized in that the second layer is arranged between the first and the third layers. In that context, the second layer can be formed essentially in a ring-shape corresponding to the first layer.

In order to adjust the snapback point in a suitably adapted manner for special applications, an advantageous further embodiment of the invention additionally provides an isolation or insulation structure arranged in the semiconductor layer between the first layer on the one hand and at least the second, third and fourth layers on the other hand. This isolation structure may, for example, comprise a recess or depression or trench that is at least partially filled with an insulating medium, i.e. in the manner of a shallow trench isolation (STI). The insulating medium or material may, for example, be a PECVD oxide. The isolation structure may be essentially ring-shaped.

A region with relatively high ohmic resistance is located under the STI structure, so that the inventive semiconductor structure, in a most preferred embodiment for adapting or adjusting its ESD characteristics, comprises a further layer of the first conductivity type having a higher doping than the semiconductor layer and located under or below the isolating structure.

Furthermore, at least one dimension of the second layer may preferably be adjusted or adapted for adjusting an onset voltage of the semiconductor structure. This is applicable particularly because the voltage drop under the second layer depends on the dimension of the second layer in the direction of the breakdown current flow between the collector and base contacts.

In order to ensure the desired functional operation of the inventive semiconductor structure in the case of an ESD event, the first, second and third layers are preferably highly doped, the fourth layer is mid-level to highly doped, and the fifth layer is mid-level to highly doped. In this context, doping concentrations are to be understood relative to one another, and also in the context of doping levels typically understood by persons of ordinary skill in the art for such structures. The specific numerical values of the dopant concentrations can be selected for the particular application at hand by a person of ordinary skill in the art based on conventional knowledge.

The inventive semiconductor structure can be advantageously used both in an integrated circuit for limiting over-voltage conditions and as a normal diode. In the context of a normal diode or in the normal operation of the IC to be protected, in order to ensure that no negative influences on the characteristics of the inventive semiconductor structure will be caused by parasitic structures or characteristics, the inventive semiconductor structure in a most preferred embodiment further comprises an insulating or isolating trench structure that isolates it from the rest of the semiconductor layer.

BRIEF DESCRIPTION OF THE DRAWINGS

In order that the invention may be clearly understood, it will now be described in connection with example embodiments thereof, with reference to the accompanying drawings, wherein.

DETAILED DESCRIPTION OF PREFERRED EXAMPLE EMBODIMENTS AND OF THE BEST MODE OF THE INVENTION

Figure 1:
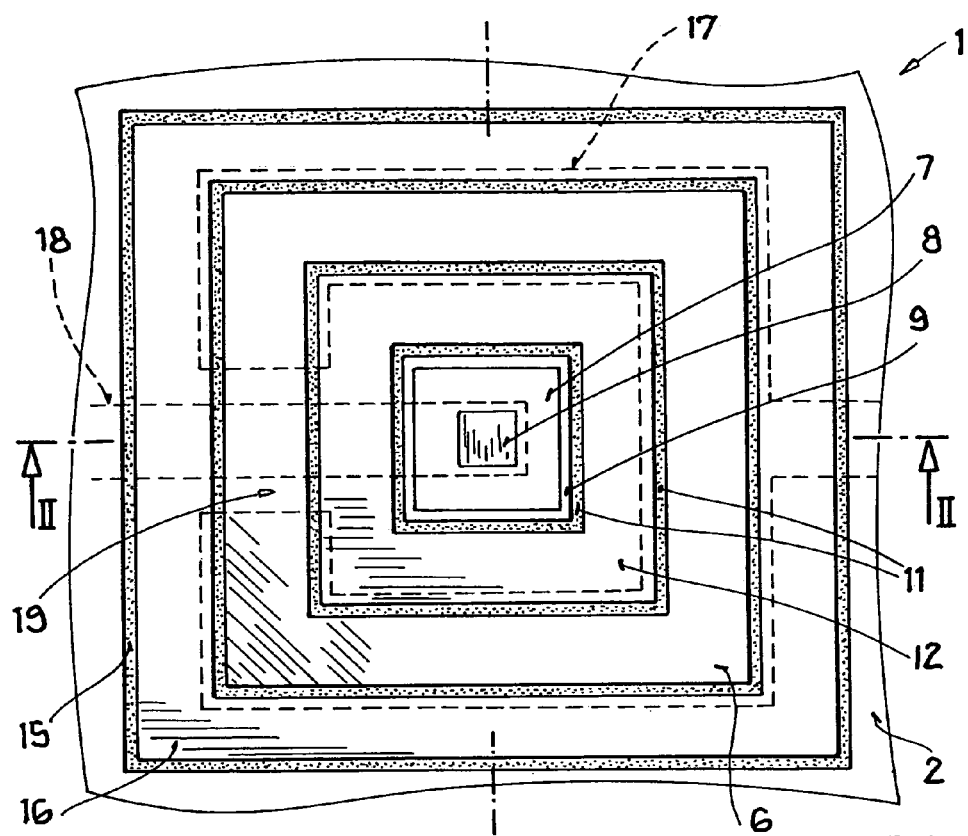
FIG. 1 is a schematic sectioned top view of an inventive semiconductor structure integrated in an integrated circuit (IC)
Figure 2:
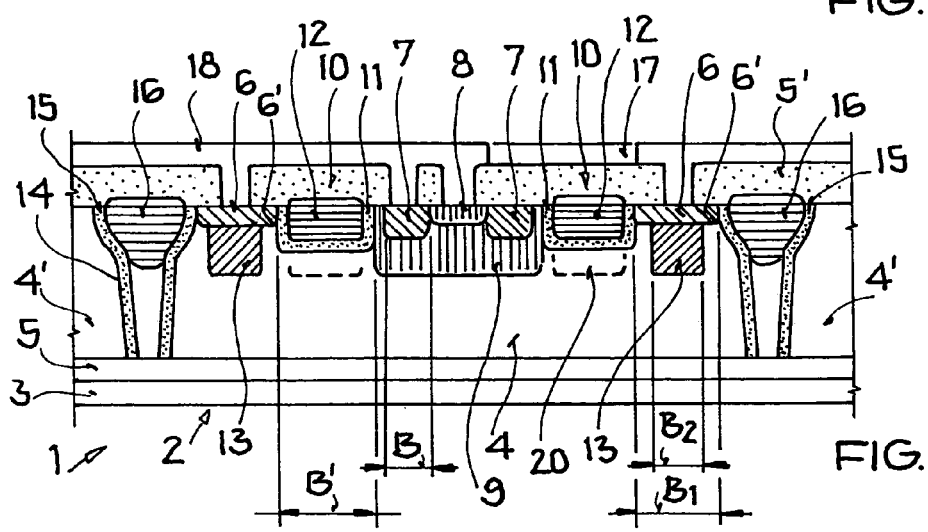
FIG. 2 is a schematic sectional view of the semiconductor structure according to FIG. 1 as seen along the vertical section plane along the section line II—II in FIG. 1.

FIG. 1 shows a first embodiment of a semiconductor structure 1 according to the invention incorporated or integrated into an IC that is to be protected from over-voltage conditions. FIG. 2 shows a vertical section view along the line II—II of the inventive semiconductor structure 1 shown in FIG. 1.

In this first embodiment, the inventive semiconductor structure 1 comprises an SOI substrate 2 that is formed of a silicon substrate 3 and an n-type or n-conductive silicon layer 4, with an insulating layer 5, for example formed of silicon oxide or the like, interposed between the substrate 3 and the silicon layer 4.

A p$^+$-doped first layer 6 and a p$^+$-doped second layer 7 are formed spaced apart from one another in the silicon layer 4. The first layer 6 serves as an anode layer. The second layer 7 has a width B and borders on an n$^+$-doped centrally arranged third layer 8, which functions as a cathode layer. The third layer 8 is arranged on a side of the second layer 7 opposite the first layer 6. In the illustrated example embodiment, the first layer 6 and the second layer 7 are essentially formed in a ring-shape around the third layer 8. Particularly as shown in FIG. 1, the ring-shape is a substantially square ring-shape, but could alternatively be rectangular, oblong, oval, circular, etc., while preferably forming a closed or substantially closed ring (i.e. a shape exhibiting a ring-shaped functionality without any functionally significant gap). Being formed "essentially" in a ring-shape thus allows for a small gap or opening in a complete ring-shape, for example for leading another electrode or layer component radially outwardly.

The second layer 7 and the third layer 8 are embedded in a fourth layer 9 that is formed in the manner of an inner n-well in the silicon layer 4. This fourth layer 9 surrounds and respectively directly contacts the second layer 7 an the third layer 8 (see FIG. 2). The inner n-well formed by the fourth layer 9 is separated and insulated from the first layer 6 by an STI isolation or insulation structure 10 that is formed by a recess, depression, or particularly a trench 11 that is at least partially filed with a PECVD oxide filling 12 or the like. In the illustrated example embodiment, the isolation structure 10 is similarly ring-shaped and arranged in the area between the inner n-well formed by the fourth layer 9 and the first layer 6. The STI isolation structure 10 has a width B'.

An n$^{(+)}$-doped fifth layer 13 is located directly in contact with and below or under the first layer 6. Like the first layer 6, the fifth layer 13 is also embodied with a ring-shape, and is arranged centered under the first layer 6. Relative to the width $B_1$ of the first layer 6, the fifth layer 13 has a smaller width $B_2$, so that it does not extend laterally to the area of edges or corners 6' of the first layer 6. The doping concentration of the fifth layer 13 is higher than that of the silicon layer 4.

The inventive semiconductor structure 1 is insulated or isolated relative to the remaining portion 4' of the silicon layer by a circumscribing trench 14 comprising a recess or depression 15 that is least partially filled with an insulating PECVD oxide filling 16. Accordingly, the portion of the silicon layer 4 located within the boundary or confines of the trench 14 represents a further outer n-well.

Above the silicon layer 4, the illustrated semiconductor structure 1 further comprises a planarizing layer 5' of boron phosphorous silicate glass (BPSG), which has respective contact vias or throughholes for metallic electrodes 17, 18, for example of aluminum, respectively above the first layer 6 on the one hand and above the second layer 7 and the third layer 8 on the other hand. The first electrode 17 contacts the first layer 6 of the inventive semiconductor structure 1, while the second electrode 18 is in contact with both the second layer 7 as well as the third layer 8. In that regard, like the first layer 6, the first electrode 17 is embodied essentially ring-shaped, but has an opening or gap 19 on one side thereof, through which the second electrode 18 extends outwardly (see FIG. 1).

The above described semiconductor structure 1 is preferably incorporated and utilized in integrated circuits (the remainder of which is not shown in detail) for limiting over-voltage conditions, i.e. protecting the circuit components or assemblies from over-voltage conditions, especially as may arise in the case of ESD events. For example, in this regard, the inventive semiconductor structure 1 may especially or principally represent a lateral bipolar pnp-transistor having a base layer 8 and an emitter layer 7 that are short-circuited via the electrode 18, as well as a collector 6. In this context, the inner n-well formed by the fourth layer 9 represents the base doping of the lateral pnp-transistor.

In the following, the functional operation of the inventive semiconductor structure in the case of an ESD event will be described in connection with those processes that take place in the above described doping arrangement, if the electrode 17 is briefly affected by and brought to a potential that is strongly negative relative to the electrode 18, for example, in connection with a negative discharge to the electrode 17. As can be readily understood by a person of ordinary skill in the art, a corresponding semiconductor structure with respectively opposite or complementary layer dopings serves for protection against a discharge with a reversed charge sign.

In the above described case, the diode or pn-junction formed between the first layer 6 and the fifth layer 13 located thereunder remains blocking or non-conducting, until an increasing voltage exceeds a certain reverse conduction voltage, whereupon, as a result of internal field forces in connection with an avalanche-like cumulative multiplication of charge carriers, a breakdown will occur between the first layer 6 (collector) and the fifth layer 13, which in turn gives rise to a current flow through the silicon layer 4 and the base formed by the layers 8 and 9. This is a so-called avalanche breakdown, or breakdown of the diode pn-junction due to the avalanche effect.

Figure 3:
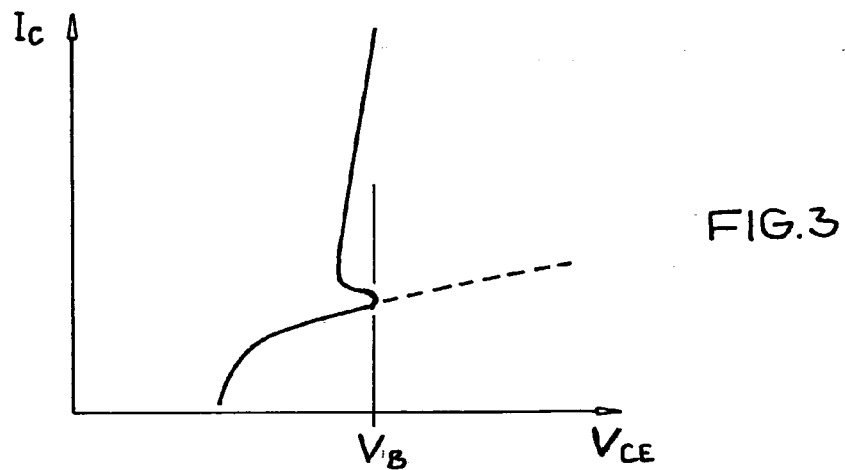
FIG. 3 is a schematic diagram of an $I_C$–$V_{CE}$ characteristic curve of a semiconductor structure according to the invention.

Due to the common or short-circuited connection of the base (layers 8 and 9) and the emitter (layer 7) of the lateral pnp-transistor, the semiconductor structure 1 at first does not exhibit a transistor characteristic or behavior, as can be seen in the $I_C$–$V_{CE}$ characteristic curve shown in FIG. 3. This characteristic curve represents the current flow $I_C$ at the collector dependent on the voltage $V_{CE}$ between the collector and the emitter. As can be seen, this characteristic curve first exhibits a steeply rising or increasing and then visibly flattening characteristic. This corresponds to the above described avalanche breakdown. With increasing current flow between the base and the collector, upon reaching an onset voltage $U_B$, this will give rise to a sufficient voltage drop along a resistance path in the base doping layer 9 along a length B under the second layer 7 (emitter layer) in order to cause a biasing of the base-emitter junction in the forward conducting direction. Due to the minority charge carriers being injected from the second layer 7 (emitter) into the base doping layer 9, this leads to a "switching" of the inventive transistor structure into a low resistance condition combined with a voltage reduction exhibiting the snapback characteristic (see FIG. 3) and an increased current flow due to the additional diffusion current between the emitter and the collector, whereby the current-carrying capacity of the structure increases by about a factor of five.

The specific snapback point, that is to say the point on the characteristic curve of FIG. 3 associated with the onset voltage $U_B$, at which the base-emitter junction becomes conductive, can be adjusted or adapted by varying the width B of the second layer 7 and also by varying the width B' of the STI isolation structure 10, all the way to a complete omission thereof, i.e. adjusting the respective width to zero.

The $n^{(+)}$-doped fifth layer 13 provided under the first layer 6 in the anode functions as a breakdown doping and serves to adjust or adapt the clamp voltage, that is to say the limiting voltage for external circuit measures. Moreover, without this doping with its special geometric configuration or embodiment, due to local field concentrations or increases at the corners 6' of the highly doped $p^+$-layer 6, the inventive semiconductor structure 1 would breakdown at these locations, which would be relatively non-uniform and which could thus limit the current-handling capacity and/or could lead to damage of the structure.

The doping concentration of the base doping in the fourth layer 9 determines the further characteristics of the lateral pnp-transistor, and can be adjusted by means of an extrinsic or impurity atom implantation in the region of the fourth layer 9, for example an arsenic implantation. In the embodiment of FIGS. 1 and 2, the implantations in the region of the fourth layer 9 and the fifth layer 13 correspond to one another, that is to say they are preferably carried out as the same single common implantation through the same implantation mask. It is possible, however, to dope the fourth layer 9 and the fifth layer 13 with different doping concentrations, e.g. through separate implantations.

In a further embodiment feature of the inventive semiconductor structure according to FIGS. 1 and 2, an additional n-doped layer 20 can be arranged under the STI isolation structure 10. This additional layer 20 is simply shown by dashed lines in FIG. 2, as an optional feature. In this manner, the relatively high ohmic resistance in this region can be reduced, and thereby the characteristics of the semiconductor structure 1 can be correspondingly influenced.

Figure 4:
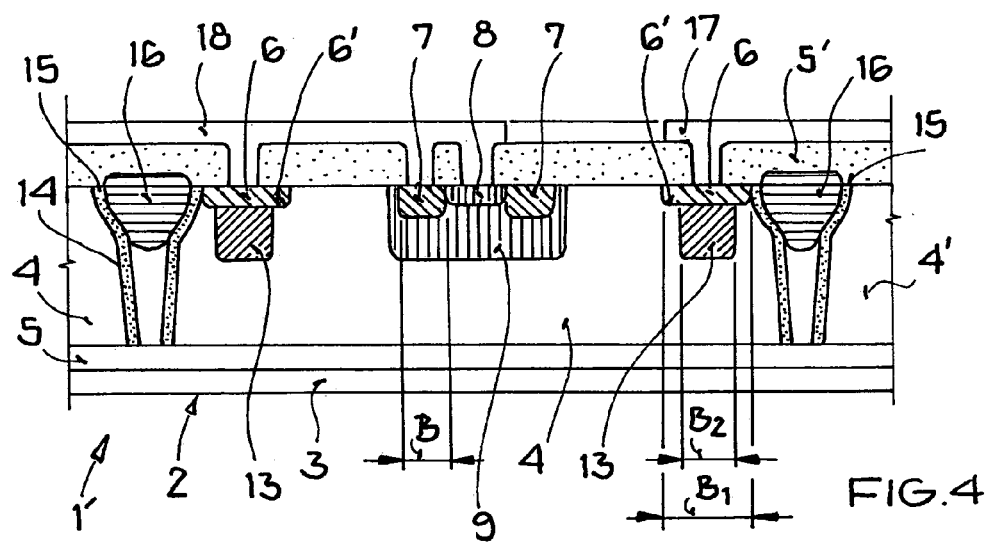
FIG. 4 is a schematic view similar to that of FIG. 2 but showing a further embodiment of an inventive semiconductor structure.

FIG. 4 shows a further embodiment of a semiconductor structure 1' according to the invention, which does not have an STI isolation structure between the first layer 6 on the one hand and the second layer 7 and base-doping fourth layer 9 on the other hand, in contrast to the above described embodiment of FIGS. 1 and 2. Such a modification also influences the characteristics of the so-constructed semiconductor structure 1' especially through a change of the resistance characteristic.

As described above, the invention thus provides a monolithically integratable semiconductor structure that can be used for safely and reliably limiting over-voltage conditions in integrated circuits, and can also be used as a normal diode.

Although the invention has been described with reference to specific example embodiments, it will be appreciated that it is intended to cover all modifications and equivalents within the scope of the appended claims. It should also be understood that the present disclosure includes all possible combinations of any individual features recited in any of the appended claims.

What is claimed is:

1. A semiconductor structure comprising:
   a substrate;
   a semiconductor layer of a first conductivity type arranged indirectly on said substrate;
   an insulating layer arranged between and separating said substrate and said semiconductor layer;
   first and second layers of a second conductivity type formed spaced apart from one another in said semiconductor layer;
   a third layer of said first conductivity type formed in contact with said second layer in said semiconductor layer;
   a first electrode in contact with said first layer;
   a second electrode in contact with said second and third layers;
   a fourth layer of said first conductivity type formed directly in contact with and surrounding said second and third layers in said semiconductor layer; and
   a fifth layer of said first conductivity type formed under said first layer in said semiconductor layer and having a higher dopant concentration relative to said semiconductor layer;
   wherein said first layer is essentially ring-shaped and surrounds said second, third and fourth layers.

2. The semiconductor structure according to claim 1, wherein, along a boundary interface between said fifth layer and said first layer, said first layer has a first dimension and said fifth layer has a second dimension less than said first dimension.

3. The semiconductor structure according to claim 2, wherein said fifth layer is arranged centered under said first layer.

4. The semiconductor structure according to claim 3, wherein said second layer is essentially ring-shaped.

5. The semiconductor structure according to claim 1, wherein said second layer is arranged between said first layer and said third layer.

6. The semiconductor structure according to claim 5, wherein said second layer is essentially ring-shaped.

7. The semiconductor structure according to claim 1, further comprising an isolation structure disposed in said semiconductor layer between said first layer on one side and at least said second, third and fourth layers on an opposite side of said isolation structure.

8. The semiconductor structure according to claim 7, wherein said isolation structure is essentially ring-shaped.

9. The semiconductor structure according to claim 7, wherein said isolation structure comprises a recess that is at least partially filled with an insulating medium.

10. The semiconductor structure according to claim 7, further comprising a further layer of said first conductivity type that is disposed under said isolation structure in said semiconductor layer and that has a higher doping concentration than said semiconductor layer.

11. The semiconductor structure according to claim 1, wherein said second layer has a dimension that is adjusted and set to a particular value so as to adjust an onset voltage of said semiconductor structure.

12. The semiconductor structure according to claim 1, wherein said first, second and third layers are each respectively doped to a high dopant concentration.

13. The semiconductor structure according to claim 1, wherein said fourth layer is doped to a medium or high dopant concentration.

14. The semiconductor structure according to claim 1, wherein said fifth layer is doped to a medium or high dopant concentration.

15. The semiconductor structure according to claim 1, further comprising a trench structure that isolates said semiconductor structure from a remainder of said semiconductor layer external to said semiconductor structure.

16. The semiconductor structure according to claim 1, wherein said first conductivity type is an n-conductivity and said second conductivity type is a p-conductivity.

17. The semiconductor structure according to claim 1, wherein said first conductivity type is a p-conductivity and said second conductivity type is an n-conductivity.

18. An integrated circuit comprising a semiconductor structure for limiting over-voltage conditions in said integrated circuit, wherein said semiconductor structure comprises:
  a substrate;
  a semiconductor layer of a first conductivity type arranged indirectly on said substrate;
  an insulating layer arranged between and separating said substrate and said semiconductor layer;
  first and second layers of a second conductivity type formed spaced apart from one another in said semiconductor layer;
  a third layer of said first conductivity type formed in contact with said second layer in said semiconductor layer;
  a first electrode in contact with said first layer;
  a second electrode in contact with said second and third layers;
  a fourth layer of said first conductivity type formed directly in contact with and surrounding said second and third layers in said semiconductor layer; and
  a fifth layer of said first conductivity type formed under said first layer in said semiconductor layer and having a higher dopant concentration relative to said semiconductor layer;
  wherein said first layer is essentially ring-shaped and surrounds said second, third and fourth layers.

19. A diode comprising a semiconductor structure that comprises:
  a substrate;
  a semiconductor layer of a first conductivity type arranged indirectly on said substrate;
  an insulating layer arranged between and separating said substrate and said semiconductor layer;
  first and second layers of a second conductivity type formed spaced apart from one another in said semiconductor layer;
  a third layer of said first conductivity type formed in contact with said second layer in said semiconductor layer;
  a first electrode in contact with said first layer;
  a second electrode in contact with said second and third layers;
  a fourth layer of said first conductivity type formed directly in contact with and surrounding said second and third layers in said semiconductor layer; and
  a fifth layer of said first conductivity type formed under said first layer in said semiconductor layer and having a higher dopant concentration relative to said semiconductor layer;
  wherein said first layer is essentially ring-shaped and surrounds said second, third and fourth layers.

* * * * *